United States Patent
Zhu

(10) Patent No.: US 10,115,931 B2
(45) Date of Patent: Oct. 30, 2018

(54) FLEXIBLE DISPLAY MODULE BONDING METHOD

(71) Applicant: SHENZHEN ROYOLE TECHNOLOGIES CO. LTD., Shenzhen, Guangdong (CN)

(72) Inventor: Jianlei Zhu, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/580,738

(22) PCT Filed: Dec. 11, 2015

(86) PCT No.: PCT/CN2015/097207
§ 371 (c)(1),
(2) Date: Dec. 8, 2017

(87) PCT Pub. No.: WO2017/096628
PCT Pub. Date: Jun. 15, 2017

(65) Prior Publication Data
US 2018/0151847 A1    May 31, 2018

(51) Int. Cl.
*H01L 21/00* (2006.01)
*H01L 51/56* (2006.01)
(Continued)

(52) U.S. Cl.
CPC ............... *H01L 51/56* (2013.01); *G02F 1/13* (2013.01); *G02F 1/167* (2013.01);
(Continued)

(58) Field of Classification Search
CPC ... H01L 51/56; H01L 27/3244; H01L 51/001; H01L 51/003; H01L 51/0097; H01L 51/5253; G02F 1/13; G02F 1/167
See application file for complete search history.

(56) References Cited

U.S. PATENT DOCUMENTS

| | | | |
|---|---|---|---|
| 6,556,268 B1 | 4/2003 | Lee et al. | |
| 8,497,509 B2 * | 7/2013 | Yamazaki | ........... H01L 21/2022 257/72 |

(Continued)

FOREIGN PATENT DOCUMENTS

| | | |
|---|---|---|
| CN | 1982996 | 6/2007 |
| CN | 102342189 | 2/2012 |

(Continued)

OTHER PUBLICATIONS

International search report dated Sep. 14, 2016 from corresponding application No. PCT/CN2015/097207.

*Primary Examiner* — Richard Booth
(74) *Attorney, Agent, or Firm* — Hauptman Ham, LLP

(57) ABSTRACT

A bonding method of a flexible display module is provided. The bonding method includes: preparing a flexible display panel having a first bonding area; attaching a middle substrate to a surface of the flexible display panel away from the first bonding area; aligning a second bonding area of an integrated drive circuit with the first bonding area; pre-laminating the first bonding area and the second bonding area at a first temperature; stripping the flexible display panel; flattening the flexible display panel; and laminating the first bonding area and the second bonding area at a second temperature to form a flexible display module.

11 Claims, 2 Drawing Sheets

(51) Int. Cl.
*G02F 1/13* (2006.01)
*G02F 1/167* (2006.01)
*H01L 27/32* (2006.01)
*H01L 51/00* (2006.01)
*H01L 51/52* (2006.01)

(52) U.S. Cl.
CPC ........ *H01L 27/3244* (2013.01); *H01L 51/001* (2013.01); *H01L 51/003* (2013.01); *H01L 51/0097* (2013.01); *H01L 51/5253* (2013.01); *H01L 2227/326* (2013.01); *H01L 2251/5338* (2013.01); *H01L 2251/566* (2013.01)

(56) References Cited

U.S. PATENT DOCUMENTS

| | | | | |
|---|---|---|---|---|
| 8,610,212 | B2* | 12/2013 | Bedell | ................... H01L 21/84 257/347 |
| 8,816,578 | B1* | 8/2014 | Peng | ................ G02F 1/133502 313/478 |

FOREIGN PATENT DOCUMENTS

| | | |
|---|---|---|
| CN | 103592785 | 2/2014 |
| CN | 104081552 | 10/2014 |
| CN | 104166491 | 11/2014 |
| CN | 104377118 | 2/2015 |

* cited by examiner

FLEXIBLE DISPLAY MODULE BONDING METHOD

RELATED APPLICATIONS

The present application is a National Phase of International Application Number PCT/CN2015/097207, filed Dec. 11, 2015.

TECHNICAL FIELD

The present disclosure relates to the technical field of a flexible display module, and particularly to a bonding method of a flexible display module.

BACKGROUND

With the development of display technologies, flexible display modules have more and more applications. The existing flexible display modules mainly include a flexible display panel and a corresponding drive circuit. After the flexible display panel is manufactured, an external drive chip needs to be connected through an electrically conductive medium on the flexible display panel, which process is generally called as bonding. The electrically conductive medium used for realizing the connection in the bonding process is generally an anisotropic conductive film (ACF), which is characterized by realizing the electrical conduction just in a direction under pressure, while being not conductive in other directions which are not under pressure. However, if the bonding is carried out directly on the flexible display panel, the flexible display panel is prone to deformation due to the high-temperature and high-pressure environment in the bonding process, and inaccurate bonding alignment also may occur, seriously affecting the quality of products.

In order to solve the above problems, insiders usually firstly attach, through a colloid, the flexible display panel to a rigid bearing plate, then perform the bonding, and finally strip the flexible display panel from the rigid bearing plate using a laser scanning method. However, there appears a new problem when stripping the flexible display panel: since the temperature of the lamination in the bonding process is mostly between 150 degrees and 200 degrees, the colloid currently arranged between the flexible display panel and the rigid bearing panel may be affected, so that the solidification state of the colloid located in the bonding area may be changed, and it is difficult to strip the colloid subsequently using the laser. At this point, the amount of the laser should be increased to enhance the decomposition of the colloid, but the increase of the laser radiation amount and time may cause a flexible substrate of the flexible display panel to carbonize and deform, creating numerous particulates, even affecting the performances of thin film transistor (TFT) devices and circuits of the flexible display panel, and finally leading to a low yield rate of the flexible display module.

SUMMARY

Embodiments of the present disclosure provide a bonding method of a flexible display module with a high yield rate.

In order to realize the above object, the embodiments of the present disclosure adopt the following technical solution.

A bonding method of a flexible display module is provided. The bonding method includes: preparing a flexible display panel having a first bonding area; attaching a middle substrate to a surface of the flexible display panel away from the first bonding area; aligning a second bonding area of an integrated drive circuit with the first bonding area; pre-laminating the first bonding area and the second bonding area at a first temperature; stripping the flexible display panel; flattening the flexible display panel; and laminating the first bonding area and the second bonding area at a second temperature.

Preferably, preparing the flexible display panel having the first bonding area includes: cleaning a glass substrate; coating a polyimide thin film on one side of the glass substrate, and forming a flexible substrate after the polyimide thin film is solidified; preparing a display layer on the flexible substrate; and stripping the flexible substrate from the glass substrate using laser light.

Preferably, preparing the display layer on the flexible substrate includes: depositing a SiNx passivation layer on a surface of the flexible substrate; manufacturing a thin film transistor array on the SiNx passivation layer; cutting the flexible substrate to form multiple display areas; and evaporating a luminescence layer on each of the display areas, and forming a protecting layer on the luminescence layer.

Preferably, attaching the middle substrate to the surface of the flexible display panel away from the first bonding area includes: coating a colloid on the middle substrate uniformly; and attaching one side of the middle substrate coated with the colloid to a surface of the flexible display panel away from the first bonding area.

Preferably, the colloid is a hydrosol.

Preferably, the middle substrate is a rigid substrate, and the flexible display panel, after being flatten, is attached to the middle substrate.

Preferably, stripping the flexible display panel includes: attaching at least one grabbing part to peripheral sides of the flexible display panel through a super binding agent; and grabbing the at least one grabbing part, and gradually stripping the flexible display panel from the middle substrate.

Preferably, a binding force of the super binding agent is greater than that of the colloid.

Preferably, one grabbing part is comprised, and the grabbing part is attached to a corner of the peripheral sides of the flexible display panel; or at least two grabbing parts are comprised, and the grabbing parts are attached to a same side of the peripheral sides of the flexible display panel.

Preferably, stripping the flexible display panel includes: attaching a corner or a side edge of the peripheral sides of the flexible display panel to a rolling part through a super binding agent; and rolling the rolling part to gradually strip the flexible display panel from the middle substrate.

Compared with the related art, when the flexible display module is manufactured through the bonding method of the present disclosure, the flexible display panel is tightly fixed to the middle substrate through attaching, so that the first bonding area keeps flat, thus the problem of difficult bonding alignment caused by inherent extension of dimension of the flexible display panel, may not occur, on this basis, it can effectively ensure accurate alignment of the first bonding area with the second bonding area when performing the pre-lamination. After the pre-lamination is completed, that is, the flexible display panel is stripped from the middle substrate, since the pre-lamination is a low-temperature process, the flexible display panel can be easily stripped from the middle substrate, avoiding the problem of damages to the flexible substrate, electronic devices, and circuits of the flexible display panel due to the increase of laser radiation amount and time. Finally, the flexible display panel is laminated after it is flattened so as to form the flexible display module. The flattened flexible display panel maintains good flatness, therefore, an area of the flexible display panel which needs to be laminated can be completely and tightly attached to a platform used for the lamination, so as to be heated uniformly in the laminating process, further ensuring the alignment accuracy and the bonding quality of the first bonding area and the second bonding area. Therefore, the flexible display module bonded through the above bonding method of the present disclosure has a high yield rate.

BRIEF DESCRIPTION OF THE DRAWINGS

In order to illustrate the technical solutions of embodiments of the present disclosure or the related art more clearly, the accompanying drawings used in the description of the embodiments will be briefly described. Apparently, the accompanying drawings described in the following are merely for some embodiments of the present disclosure, and a person ordinarily skilled in the art still can obtain other accompanying drawings according to these accompanying drawings without any creative effort.

DETAILED DESCRIPTION

Below the technical solutions of embodiments of the present disclosure will be described clearly and completely in conjunction with the accompanying drawings of the embodiments of the present disclosure. Apparently, some but not all of embodiments of the present disclosure are described. Based on the embodiments of the present disclosure, all the other embodiments, which a person ordinarily skilled in the art obtains without paying creative effort, fall within the scope of protection of the present disclosure.

Referring to FIG. 1 to FIG. 5, an embodiment of the present disclosure provides a bonding method of a flexible display module. The bonding method mainly includes the following steps.

Figure 1:
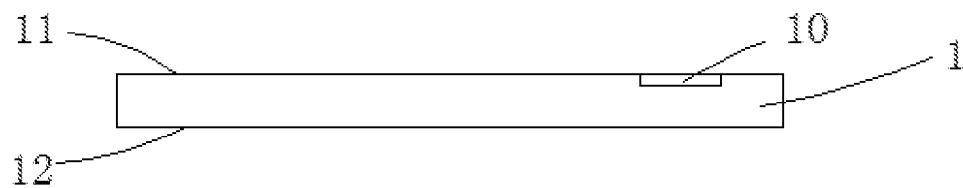
FIG. 1 to FIG. 5 are structural schematic views of manufacturing procedures corresponding to various steps in a bonding method of a flexible display module provided in the present disclosure.

Step 1, a flexible display panel 1 is prepared, where a first surface 11 of the flexible display panel 1 is provided with a first bonding area 10, as shown in FIG. 1.

Figure 2:
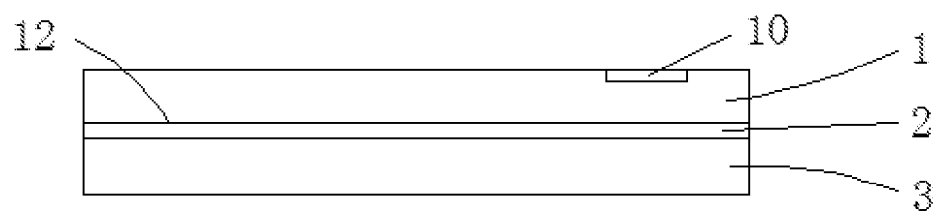

Step 2: a middle substrate 3 is attached to a second surface 12 of the flexible display panel 1 arranged opposite to the first surface 11, so that the first bonding area keeps flat, as shown in FIG. 2.

Figure 3:
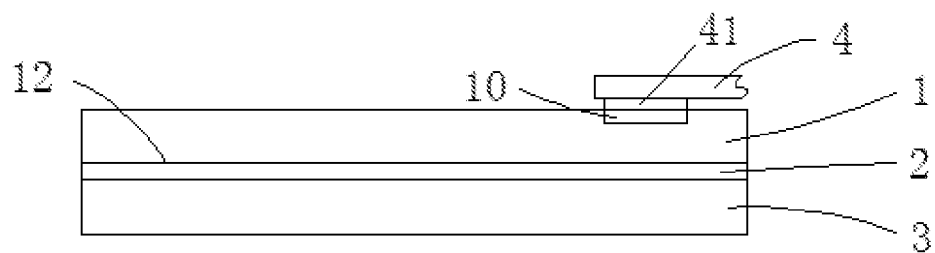

Step 3: an integrated drive circuit 4 is provided. The integrated drive circuit 4 includes a second bonding area 41. The second bonding area 41 is aligned with the first bonding area 10, and the first bonding area 10 and the second bonding area 41 are pre-laminated at a first temperature, as shown in FIG. 3.

Figure 4:
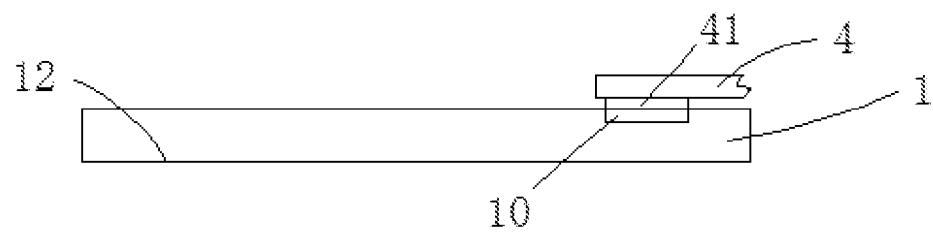

Step 4: the flexible display panel 1 is stripped from the middle substrate 3, as shown in FIG. 4.

Figure 5:
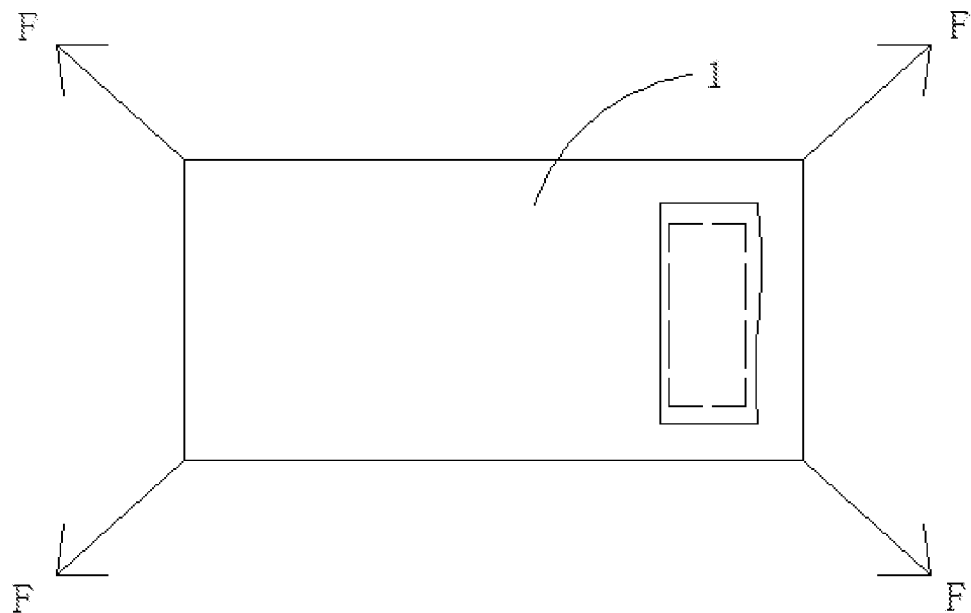

Step 5: the flexible display panel 1 is flattened, and the first bonding area 10 and the second bonding area 41 are laminated at a second temperature to form the flexible display module, as shown in FIG. 5. In this step, the process of bonding the integrated drive circuit 4 to the flexible display panel 1 is completed, so that the flexible display module is formed.

In the embodiment, the flexible display panel 1 is tightly fixed onto the middle substrate 3 through attaching, so that the first bonding area 10 keeps flat, thus the problem of difficult bonding alignment caused by inherent extension of dimension of the flexible display panel 1 may not occur, and on this basis, it can effectively ensure accurate alignment of the first bonding area 10 with the second bonding area 41 when performing the pre-lamination. After the pre-lamination is completed, that is, the flexible display panel 1 is stripped from the middle substrate 3, since the pre-lamination is carried out at the first temperature which is defined as a low temperature, including, but not limited to temperatures in a range of 60 degrees to 90 degrees, the flexible display panel 1 can be easily stripped from the middle substrate 3, avoiding the problem of damages to the flexible substrate, electronic devices, and circuits of the flexible display panel 1 due to the increase of laser radiation amount and time. Finally, the flexible display panel 1 is laminated after it is flattened to form the flexible display module. The flattened flexible display panel 1 maintains good flatness, therefore, an area of the flexible display panel 1 which needs to be laminated can be completely and tightly attached to a platform used for the lamination, so that the first bonding area 10 and the second bonding area 41 can be heated uniformly in the laminating process, further ensuring the alignment accuracy and the bonding quality of the first bonding area 10 and the second bonding area 41. Therefore, the flexible display module bonded through the above bonding method has a high yield rate.

It should be understood that "flatten" referred to in the present embodiment includes, but not limited to enabling a structure (for example, the flexible display panel 1) to be flattened to realize a flat state in a manner such as expanding, spreading, and stretching.

Furthermore, in Step 1 of the bonding method of the flexible display module, preparation of the flexible display panel 1 includes the follows.

Step 11: a glass substrate is cleaned.

Step 12: a polyimide thin film is coated on one side of the glass substrate, and a flexible substrate is formed after the polyimide thin film is solidified.

Step 13: a display layer is prepared on the flexible substrate.

Step 14: the flexible substrate is stripped from the glass substrate using laser light to form the flexible display panel 1.

In the above process of preparing the flexible display panel 1, since the flexible substrate is tightly fixed and bonded onto the surface of the glass substrate before the laser-stripping, the flexible substrate has a flat surface, and the display layer can be formed on the flexible substrate with high quality, realizing a high-resolution display function of the flexible display panel 1. Also, since the flexible substrate is stripped from the glass substrate before the integrated drive circuit is bonded, a solicitation state of a colloid connecting the flexible substrate and the glass substrate may not be changed, the flexible substrate can be smoothly stripped through a simple laser radiation process, and the flexible substrate and the display layer may not be damaged.

Furthermore, Step S13 of the process of preparing the flexible display panel 1 can be further detailed as the follows.

Step S131: a SiNx passivation layer is deposited on a surface of the flexible substrate.

Step S132: a thin film transistor (TFT) array is manufactured on the SiNx passivation layer.

Step S133: the flexible substrate is cut to form multiple display areas.

Step S134: a luminescence layer is evaporated on each of the display areas, and a protecting layer is formed on the luminescence layer.

Preferably, the luminescence layer can be an electronic ink display layer so that the display layer has ultralow power consumption, facilitating reduction of energy consumption of the flexible display module.

Furthermore, in Step 2 of the bonding method of flexible display module, the flexible display panel can be attached to the middle substrate through a colloid 2, that is, the colloid can be uniformly coated on the middle substrate, and then one side of the middle substrate coated with the colloid is attached to a surface of the flexible display panel away from the first bonding area. In the bonding method of the flexible display module, since the flexible display panel 1 is stripped from the middle substrate 3 after the pre-lamination is completed, and the pre-lamination is a low-temperature process (the pre-lamination temperature is usually between 60 degrees and 90 degrees), the solidification state of the colloid 2 connected between the flexible display panel 1 and the middle substrate 3 may not be changed, and the flexible display panel 1 can be easily stripped from the middle substrate 3, avoiding the problem of damages to the flexible substrate, electronic devices, and circuits of the flexible display panel 1 due to the increase of laser radiation amount and time.

Furthermore, the colloid 2 used is a colloid which can realize a transitional bonding function. Preferably, the colloid 2 is a hydrosol.

Furthermore, the middle substrate 3 is a rigid substrate. The flexible display panel 1, after being flatten, is attached to the rigid substrate, thereby the first bonding area 10 is enabled to keep flat, and on this basis, it can effectively ensure accurate alignment of the first bonding area 10 with the second bonding area 41 when performing the pre-lamination. The rigid substrate is preferably a glass substrate.

Furthermore, in Step 3 of the bonding method of the flexible display module, firstly an anisotropic conductive film (ACF) is attached to a bonding surface of the first bonding area 10 or a bonding surface of the second bonding area 41, then the first bonding area 10 and the second bonding area 41 are aligned and pre-laminated. The anisotropic conductive film is used to realize the electrical connection of the first bonding area 10 and the second bonding area 41.

As a preferred embodiment of the present disclosure, in Step 4 of the bonding method of the flexible display module, firstly a grabbing part can be attached to peripheral sides of the flexible display panel 1 through a super binding agent, and then the flexible display panel 1 is gradually stripped from the middle substrate 3 by grabbing the grabbing part. It should be understood that the super binding agent does not specifically refer to a certain kind of binding agent, but it just needs to have a binding force greater than that of the colloid 2, and can enable the flexible display panel 1 to be stripped from the middle substrate 3. The peripheral sides of the flexible display panel 1 refer to peripheral areas of the display area of the flexible display panel 1. These peripheral areas generally may be cut off after the flexible display module is prepared, therefore, the grabbing part finally may escape from the flexible display panel 1, and may not affect the utilization of the flexible display panel 1.

Preferably, it is possible that just one grabbing part is provided, and it is attached to a position of the peripheral sides of the flexible display panel 1. It is also possible that at least two grabbing parts are simultaneously provided, and attached to a same side of the peripheral sides of the flexible display panel 1. The number of the grabbing part and the attaching position can be flexibly set according to the size and the shape of the flexible display panel 1.

As another preferred embodiment of the present disclosure, in Step 4 of the bonding method of the flexible display module, a corner or a side edge of the peripheral sides of the flexible display panel 1 can be attached to a rolling part through a super binding agent, then the rolling part is rolled to gradually strip the flexible display panel from the middle substrate. It should be understood that the super binding agent does not specifically refer to a certain kind of binding agent, but it just needs to have the binding force greater than that of the colloid 2, and can enable the flexible display panel 1 to be stripped from the middle substrate 3. The peripheral sides of the flexible display panel 1 refer to peripheral areas of the display area of the flexible display panel 1. These peripheral areas generally may be cut off after the flexible display module is prepared, therefore, the rolling part finally may escape from the flexible display panel 1, and may not affect the utilization of the flexible display panel 1.

Preferably, in Step 5 of the bonding method of the flexible display module, as shown in FIG. 5, when flattening the flexible display panel 1, a tensioning force F can be applied to four corners of the flexible display panel 1, to tension the flexible display panel 1 according to directions pointed by arrows (i.e., directions away from the center of the flexible display panel 1). The flattened flexible display panel 1 maintains good flatness, therefore, an area of the flexible display panel 1, which needs to be laminated, can be completely and tightly attached to a platform for performing the lamination, so that the first bonding area 10 and the second bonding area 41 can be uniformly heated in the laminating process, further ensuring the alignment accuracy and the bonding quality of the first bonding area 10 and the second bonding area 41.

The bonding method of the flexible display module provided in the embodiments of the present disclosure is introduced in detail in the above. Specific examples are used in the present text to illustrate the principle and the embodiments of the present disclosure. The above description of the embodiments is merely used to facilitate understanding of the method of the present disclosure and the core idea thereof. Meanwhile, for a person ordinarily skilled in the art, modifications can be made to the specific embodiments and application range according to the thought of the present disclosure. To sum up, the contents in the present specification should not be construed as limiting the present disclosure.

What is claimed is:
1. A bonding method of a flexible display module, the bonding method comprising:
  preparing a flexible display panel having a first bonding area;
  attaching a middle substrate to a surface of the flexible display panel away from the first bonding area;
  aligning a second bonding area of an integrated drive circuit with the first bonding area;
  pre-laminating the first bonding area and the second bonding area at a first temperature;
  stripping the flexible display panel;
  flattening the flexible display panel; and
  laminating the first bonding area and the second bonding area at a second temperature.
2. The bonding method of the flexible display module of claim 1, wherein preparing the flexible display panel having the first bonding area comprises:
  cleaning a glass substrate;

coating a polyimide thin film on one side of the glass substrate, and forming a flexible substrate after the polyimide thin film is solidified;

preparing a display layer on the flexible substrate; and stripping the flexible substrate from the glass substrate using laser light.

3. The bonding method of the flexible display module of claim 2, wherein preparing the display layer on the flexible substrate comprises:

depositing a SiNx passivation layer on a surface of the flexible substrate;

manufacturing a thin film transistor array on the SiNx passivation layer;

cutting the flexible substrate to form a plurality of display areas; and evaporating a luminescence layer on each of the display areas, and forming a protecting layer on the luminescence layer.

4. The bonding method of the flexible display module of claim 1, wherein attaching the middle substrate to the surface of the flexible display panel away from the first bonding area comprises:

coating a colloid on the middle substrate uniformly; and attaching one side of the middle substrate coated with the colloid to a surface of the flexible display panel away from the first bonding area.

5. The bonding method of the flexible display module of claim 4, wherein the colloid is a hydrosol.

6. The bonding method of the flexible display module of claim 1, wherein the middle substrate is a rigid substrate, and the flexible display panel is attached to the middle substrate after being flatten.

7. The bonding method of the flexible display module of claim 4, wherein stripping the flexible display panel comprises:

attaching at least one grabbing part to peripheral sides of the flexible display panel through a super binding agent; and grabbing the at least one grabbing part, and gradually stripping the flexible display panel from the middle substrate.

8. The bonding method of the flexible display module of claim 7, wherein a binding force of the super binding agent is greater than that of the colloid.

9. The bonding method of the flexible display module of claim 7, wherein one grabbling part is comprised, and the grabbing part is attached to a corner of the peripheral sides of the flexible display panel.

10. The bonding method of the flexible display module of claim 4, wherein stripping the flexible display panel comprises:

attaching a corner or a side edge of peripheral sides of the flexible display panel to a rolling part through a super binding agent; and rolling the rolling part to gradually strip the flexible display panel from the middle substrate.

11. The bonding method of the flexible display module of claim 7, wherein at least two grabbing parts are comprised, and the grabbing parts are attached to a same side of the peripheral sides of the flexible display panel.

* * * * *